(12) United States Patent
Nguyen et al.

(10) Patent No.: US 6,496,044 B1
(45) Date of Patent: Dec. 17, 2002

(54) HIGH-SPEED OUTPUT CIRCUIT WITH LOW VOLTAGE CAPABILITY

(75) Inventors: Hy V. Nguyen, San Jose, CA (US); Gubo Huang, Milpitas, CA (US); Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/016,950

(22) Filed: Dec. 13, 2001

(51) Int. Cl.[7] ................................................ H03K 3/00

(52) U.S. Cl. ........................ 327/108; 327/112; 326/81

(58) Field of Search ........................ 327/108–112, 333, 327/434, 436, 437; 326/62, 80–83, 87

(56) References Cited

U.S. PATENT DOCUMENTS 6,169,421 B1 * 1/2001 Bryan et al. .................. 326/83

* cited by examiner

Primary Examiner—Kenneth B. Wells
(74) Attorney, Agent, or Firm—Lois D. Cartier (57) ABSTRACT

Output circuits that provide compatibility with various input and output voltage levels without sacrificing performance. A pull-up on an output terminal is gated by an internal node, and the invention encompasses various circuits and means for placing a data input signal on this internal node. One embodiment includes a level shifter on the data input path, while also providing an alternative path through the output circuit that bypasses the level shifter. When the input data value goes high, the alternative path quickly places an attenuated high value on the internal node. The level shifter then becomes active and raises the voltage on the internal node to the output power high level, ensuring that the output pull-up is completely off.

36 Claims, 4 Drawing Sheets

HIGH-SPEED OUTPUT CIRCUIT WITH LOW VOLTAGE CAPABILITY

FIELD OF THE INVENTION

The invention relates to output buffers in integrated circuits (ICs). More particularly, the invention relates to a high-speed output buffer for an IC, the output buffer having the capability to interface with other circuits operating at various voltage levels including low voltage levels.

BACKGROUND OF THE INVENTION

Integrated circuits (ICs) are growing denser and faster with every product generation. As ICs pack more and more circuitry into the same amount of silicon area and operate at higher and higher speeds, the power consumption increases rapidly. Increased power consumption is undesirable for several reasons. For example, high power consumption makes a device unsuitable for applications that run on battery power. In addition, high power consumption causes a device to give off large amounts of heat, which can be difficult and expensive to dissipate.

One method of lowering the power consumption of an IC is to decrease the operating voltage. Therefore, IC operating voltages have been steadily dropping over the years. Where once virtually all ICs operated at 5 volts, operating voltages of 3.3 volts and 2.5 volts are now common, and 1.8 volt ICs are also available. Because of this wide range of operating voltages, many ICs are designed to interface with other ICs operating at different voltage levels.

Another critical issue in today's faster ICs is the speed at which data can be passed between different ICs. Output buffers on an IC must drive not only the capacitance of the input/output (I/O) pad, but also the capacitance of the bonding wire to the external bus, the bus wire itself, and the input buffers of the destination ICs. Therefore, the speed at which data can reliably be driven at the output pads is often the factor that determines the operating speed of an entire system.

Further, an electronic circuit operating at a lower voltage level (e.g., 1.8 volts), is inherently slower than the same electronic circuit operating at a higher voltage level (e.g., 3.3 volts or 5 volts). Hence, as operating voltages are lowered to reduce power consumption, output buffer speed becomes even more critical. Therefore, the "core" (interior portion) of an IC often operates at a lower voltage level to reduce power consumption, while the I/O circuits of the IC operate at a higher voltage level to improve output performance.

Therefore, it is desirable to provide an output circuit that can accept an input signal at one voltage level (e.g., a lower voltage level) and provide an output signal at another voltage level (e.g., a higher voltage level) while maintaining a high operating speed. It is further desirable for the output circuit to be compatible with input signals arriving at the pad at a higher voltage than the operating voltage of the output circuit.

SUMMARY OF THE INVENTION

The invention provides output circuits that provide compatibility with various input and output voltage levels without sacrificing performance. A pull-up on an output terminal is gated by an internal node, and the invention encompasses various means for quickly placing a data input signal on this internal node. One embodiment includes a level shifter on the data input path, while also providing an alternative path through the output circuit that bypasses the level shifter. For example, when the input data value goes high, the alternative path quickly places an attenuated high value on the internal node, then the level shifter becomes active and "boosts" the voltage on the internal node to the output power high level, ensuring that the output pull-up is completely off.

An output circuit according to a first embodiment of the invention includes a level shifter that adjusts the voltage level of a first data input signal to the voltage high level of the output circuit, and provides the adjusted signal on a level shifter output node. The output circuit also includes an output terminal (which can be connected to an output pad or an I/O pad), and a pull-up and pull-down on the output terminal. The output pull-down is gated by a second data input signal that can be separate from, related to, derived from, or the same signal as the first data input signal. In one embodiment, the first and second data input signals are derived from a common data input signal.

The output circuit of the first embodiment also includes an internal node that gates the pull-up on the output terminal. The speed of this output pull-up usually determines the operating speed of the output circuit. Hence, the invention encompasses various means for quickly placing the first data input signal on the internal node driving the output pull-up.

A first path through the output circuit routes the first data input signal through a non-inverting circuit (in one embodiment comprising an inverter and two N-channel transistors) that bypasses the level shifter and places the signal onto the internal node. The first path is fast, but does not pull the internal node rail-to-rail, i.e., the internal node is not pulled all the way to the power high voltage level VDDE. Thus, a second path is also provided.

The second path through the output circuit routes the first data input signal through the level shifter to the level shifter output node. The output circuit includes a pull-up on the internal node, e.g., an N-channel transistor gated by the output node of the level shifter. A pass transistor is also provided between the internal node and the level shifter output node, gated by the signal on the output terminal. These two devices ensure that the internal node functions rail-to-rail, and therefore turns the pull-up on the output terminal completely off.

Other embodiments of the invention include one or more of the following additional circuits: a configurable slew rate control circuit; an enable circuit that configurably disables the second path through the output circuit; a high voltage tolerance circuit; an N-well control circuit; and a ground bounce current reduction circuit. In one embodiment, the output circuit forms a portion of a programmable logic device (PLD), and a slew rate configuration signal is stored in a configuration memory cell of the PLD. In another embodiment, an enable signal is similarly stored.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

The present invention is believed to be applicable to a variety of electronic circuits. The present invention has been found to be particularly applicable and beneficial for integrated circuits (ICs) including programmable logic devices (PLDs) such as complex programmable logic devices (CPLDs) and field programmable gate arrays (FPGAs). However, the present invention is not so limited. Further, in the following description, numerous specific details are set forth to provide a more thorough understanding of the present invention. However, it will be apparent to one skilled in the art that the present invention may be practiced without these specific details.

Figure 1:
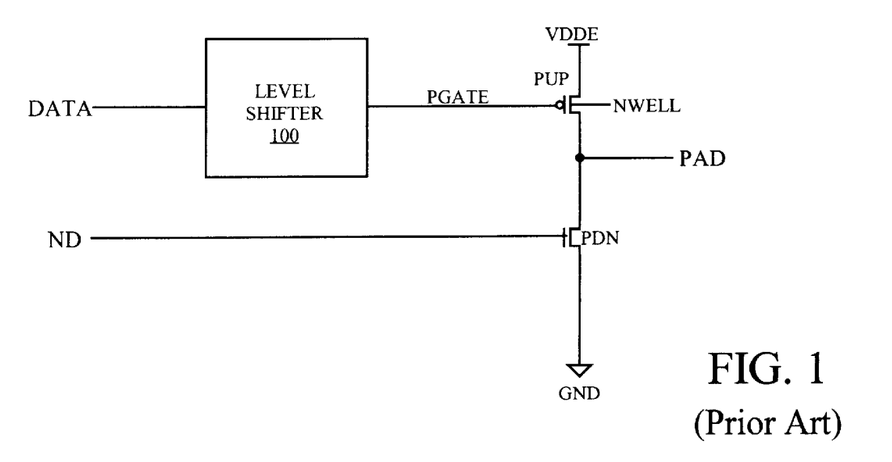
FIG. 1 is a schematic diagram of a prior art output circuit.

FIG. 1 is a schematic diagram of a prior art output circuit that is compatible with other circuits having a plurality of voltage levels. The output circuit of FIG. 1 includes a level shifter 100 and an output driver driven by an output signal PGATE of the level shifter and providing the output signal on output terminal PAD. (In the present specification, the same reference characters are used to refer to terminals, signal lines, and their corresponding signals.)

The output driver includes a pull-up PUP coupled between output terminal PAD and the power high VDDE, and a pull-down PDN coupled between output terminal PAD and ground GND. Pull-up PUP is a P-channel transistor having an NWELL terminal, which is typically coupled to power high VDDE or the highest value placed on output terminal PAD by an outside source, whichever is higher. Pull-up PUP also has a gate terminal driven by the output signal PGATE from the level shifter. Pull-down PDN is an N-channel transistor typically driven by another input signal ND having the same logical value as the DATA input to the level shifter, although the two signals DATA and ND may have different timing characteristics.

Level shifters are well known in the art, so level shifter 100 is not described in detail here. There are many different level shifters that can be used. Chen et al. describe one compatible CMOS level shifter in U.S. Pat. No. 4,978,870, which is hereby incorporated by reference. In summary, level shifter 100 accepts input signal DATA, which can be at the same or a different voltage level from the power high VDDE used by the output circuit, as long as the power high level on input signal DATA is higher than the threshold voltage Vtn of an N-channel transistor. Level shifter 100 provides from input signal DATA the level shifter output signal PGATE, which has a power high level of VDDE.

Thus, level shifter 100 provides the capability to interface with other circuits having voltage levels different from that of the output circuit. Therefore, the core of the IC can be operated at a lower voltage (thus reducing the power consumption of the IC), while the output circuits are operated at a higher voltage (VDDE), thus providing the high speed I/O interface demanded by system designers.

Note that a level shifter is typically not applied to the path between input signal ND and the output pull-down. As long as the power high level of input signal ND is higher than the threshold voltage Vtn of an N-channel transistor, pull-down PDN will function properly. Therefore, a level shifter is not necessary on this path.

A drawback of the output circuit of FIG. 1 is that the voltage level flexibility of the circuit is obtained at the price of speed on the output pull-up path. An output circuit is slowest when pulling up the output terminal PAD to the power high VDDE voltage level. Therefore, the critical path through an output circuit is the path from input node DATA, through node PGATE to pull-up PUP, and hence to output terminal PAD. A level shifter necessarily has a delay greater than that of an inverter. Therefore, the inclusion of level shifter 100 in the output circuit of FIG. 1 negatively impacts the speed of the output circuit.

The output circuits of the invention address this limitation by removing the level shifter from the critical path through the output circuit, or, to put it another way, by providing an alternative path through the circuit that bypasses the level shifter.

First Embodiment

Figure 2:
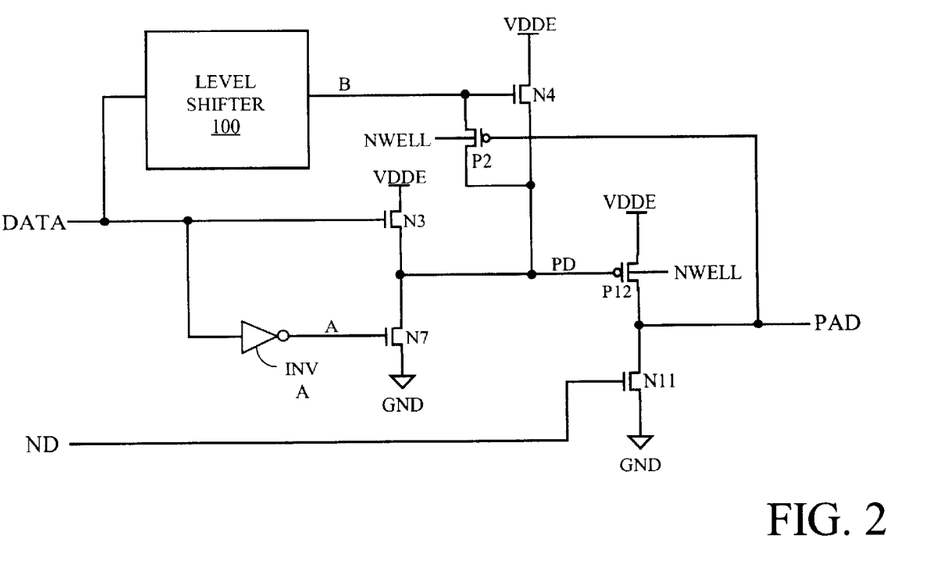
FIG. 2 is a schematic diagram of an output circuit according to a first embodiment of the invention.

FIG. 2 is a schematic diagram of a first embodiment of the output circuit according to the present invention. The output circuit of FIG. 2 includes level shifter 100, P-channel transistors P2 and P12, N-channel transistors N3, N4, N7, and N11, and inverter INVA. In one embodiment, inverter INVA uses the core voltage VDDC, rather than the power high level VDDE used by most of the output circuit.

Figure 3A:
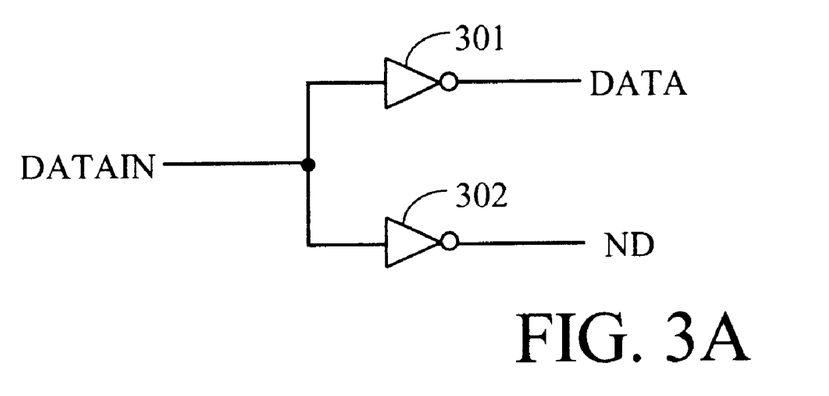
FIG. 3A is a first schematic diagram showing a first possible relationship between the DATA and ND input signals.
Figure 3B:
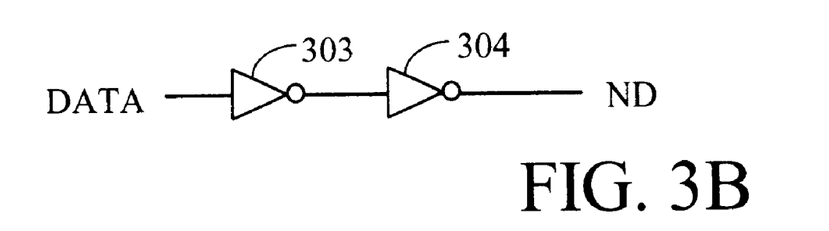
FIG. 3B is a second schematic diagram showing a second possible relationship between the DATA and ND input signals.
Figure 3C:
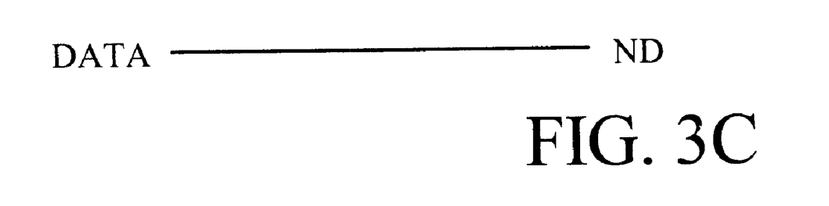
FIG. 3C is a third schematic diagram showing a third possible relationship between the DATA and ND input signals.

P-channel transistor P12 and N-channel transistor N11 provide a pull-up and pull-down, respectively, for the output terminal PAD. P-channel transistor P12 is gated by internal node PD. N-channel transistor N11 is gated by input signal ND, which can be related to input signal DATA. For example, input signals DATA and ND can be related as shown in any of FIGS. 3A–3C. FIG. 3A shows one embodiment in which a common source signal DATAIN is routed through two inverters 301 and 302 to generate input signals DATA and ND, respectively. FIG. 3B shows an embodiment where input signal DATA is twice inverted through inverters 303 and 304 to generate input signal ND. FIG. 3C shows an embodiment where input signals DATA and ND are the same signal. Input signals DATA and ND can also be unrelated or related in other ways (not shown).

On a first path through the output circuit, input signal DATA is passed through level shifter 100, as in FIG. 1, but the level shifter drives node B, instead of directly driving internal node PD. Node B drives N-channel transistor N4, which is coupled between internal node PD and power high VDDE. Thus, transistor N4 acts as a pull-up to node PD, and provides a means for applying a voltage level of the power high VDDE to the internal node PD when the level shifter output signal B is high. P-channel transistor P2 provides a pass transistor between node B and internal node PD, gated by the output terminal PAD. Thus, transistor P2 provides a means for applying the level shifter output signal B to the internal node PD when a value on the output terminal PAD is low.

On a second path through the output circuit, input signal DATA drives N-channel transistor N3, which provides a second pull-up on internal node PD. Input signal DATA also drives N-channel transistor N7, a pull-down on internal node PD, through inverter INVA. (In one embodiment, not shown, the output of inverter INVA is also provided to level shifter 100.) Thus, the value on data input terminal DATA is applied to internal node PD without passing through level shifter The second path through the output circuit provides a fast response time from input signal DATA to internal node PD, and hence to output terminal PAD. The first path through the output circuit provides the full power high voltage level VDDE at internal node PD, and hence completely shuts off output pull-up P12 when the DATA input signal is high.

P-channel transistors P2 and P12 have N-wells tied to node NWELL. Node NWELL can be tied to power high VDDE, or to a different voltage level. For example, when output terminal PAD can be driven to a value higher than VDDE by an external source, it is desirable to tie node NWELL to a voltage level at least equal to the voltage on output terminal PAD. This is desirable because, for example, if the voltage level of node NWELL is lower than the voltage on output terminal PAD, then P-channel transistor P12 functions as a forward bias diode rather than as a reverse-biased diode, which is the desired functionality.

In one embodiment, node NWELL is held at the higher of power high VDDE and the voltage on output terminal PAD. One such N-well generation circuit is described below, with reference to FIG. 4.

The behavior of the output circuit of FIG. 2 is now explained for two different voltage combinations. As previously described, VDDE designates the power high voltage level for the output circuit. The power high voltage level for the "core" circuitry, e.g., the circuitry generating the DATA and ND input signals for the output circuit, is designated VDDC.

In a first example, VDDE and VDDC are both the same, e.g., 1.8 volts. When input signal DATA goes low, the voltage at node A rises to 1.8 volts, and N-channel transistor N7 turns on. N-channel transistor N3 turns off. Therefore, internal node PD is pulled low, and output pull-up P12 turns on. Input signal ND follows signal DATA, and is therefore also low, so output pull-down N11 is off. Thus, output terminal PAD goes high.

In one embodiment, N-channel transistor N7 is a large device, so that internal node PD is pulled down very quickly. Because internal node PD controls the pull-up speed on output terminal PAD, this leads to a fast pull-up speed on output terminal PAD.

When input signal DATA goes high, node A goes low, and N-channel transistor N7 turns off. N-channel transistor N3 turns on, and passes an attenuated high signal (1.8 volts minus Vtn, the N-channel threshold voltage) to internal node PD. Output pull-up P12 turns off, but may not be fully off, i.e., there may be some leakage current through transistor P12. Input signal ND has followed input signal DATA and gone high, so output pull-down N11 is on, and output terminal PAD goes low.

Meanwhile, the high value on input signal DATA is passed through level shifter 100 to level shifter output node B, which turns on N-channel transistor N4. Transistor N4 also passes an attenuated high signal (1.8 volts–Vtn) to internal node PD. However, the low value on output terminal PAD turns on P-channel transistor P2, which passes the full 1.8 volts from node B to internal node PD. Now that internal node PD has reached the full power high value VDDE, output pull-up P12 is turned completely off.

In one embodiment, N-channel transistor N3 is a large device, so that internal node PD is pulled up very quickly. Because internal node PD controls the pull-up speed on output terminal PAD, this causes output pull-up P12 to turn off very quickly. Along with a large N-channel transistor N11, this leads to a fast pull-down speed on output terminal PAD.

In a second example, VDDC is a lower voltage (e.g., 1.8 volts) and VDDE is a higher voltage (e.g., 2.5 volts). When input signal DATA goes low, the output circuit behaves as described above for the first example.

When input signal DATA goes high, node A goes low, N-channel transistor N7 turns off, and N-channel transistor N3 turns on. N-channel transistor N3 passes an attenuated high signal (VDDC–Vtn, or 1.8 volts–Vtn) to internal node PD. Output pull-up P12 turns off, but may not be fully off. Input signal ND has followed input signal DATA and gone high, so output pull-down N11 is on, and output terminal PAD goes low.

Meanwhile, the high value on input signal DATA is passed through level shifter 100 to level shifter output node B, which goes high to the power high level VDDE, or 2.5 volts. N-channel transistor N4 turns on, and passes an attenuated high signal (VDDE–Vtn) to internal node PD. Thus, internal node PD is now at a voltage level of (2.5 volts–Vtn). However, the low value on output terminal PAD turns on P-channel transistor P2, which passes the full 2.5 volts from node B to internal node PD. Now that internal node PD has reached the full power high value VDDE, output pull-up P12 is turned completely off.

Second Embodiment

Figure 4:
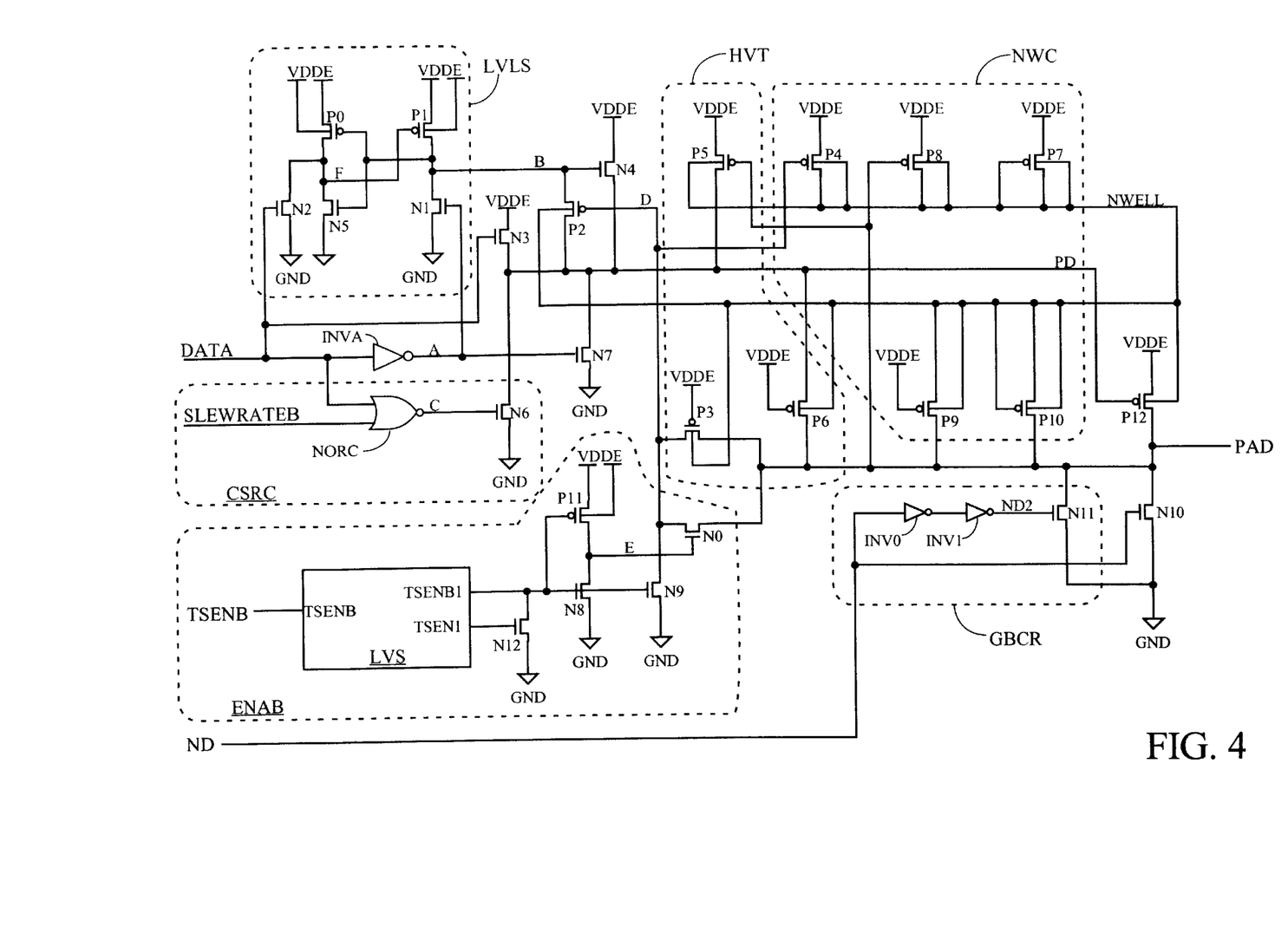
FIG. 4 is a schematic diagram of an output circuit according to a second embodiment of the invention.

FIG. 4 is a schematic diagram of a second embodiment of the output circuit of the present invention. This embodiment includes additional capabilities not provided in the embodiment of FIG. 2. Added to the elements present in FIG. 2 are the details of one embodiment of level shifter 100 (designated LVLS in FIG. 4), a configurable slew rate control circuit CSRC, an enable circuit ENAB, a high voltage tolerance circuit HVT, a ground bounce current reduction circuit GBCR, and an N-well control circuit NWC. The circuit of FIG. 4 also includes two input signals not present in the circuit of FIG. 2: SLEWRATEB, a slew rate configuration signal that controls slew rate control circuit CSRC; and TSENB, an enable signal that controls enable circuit ENAB.

Figure 5:
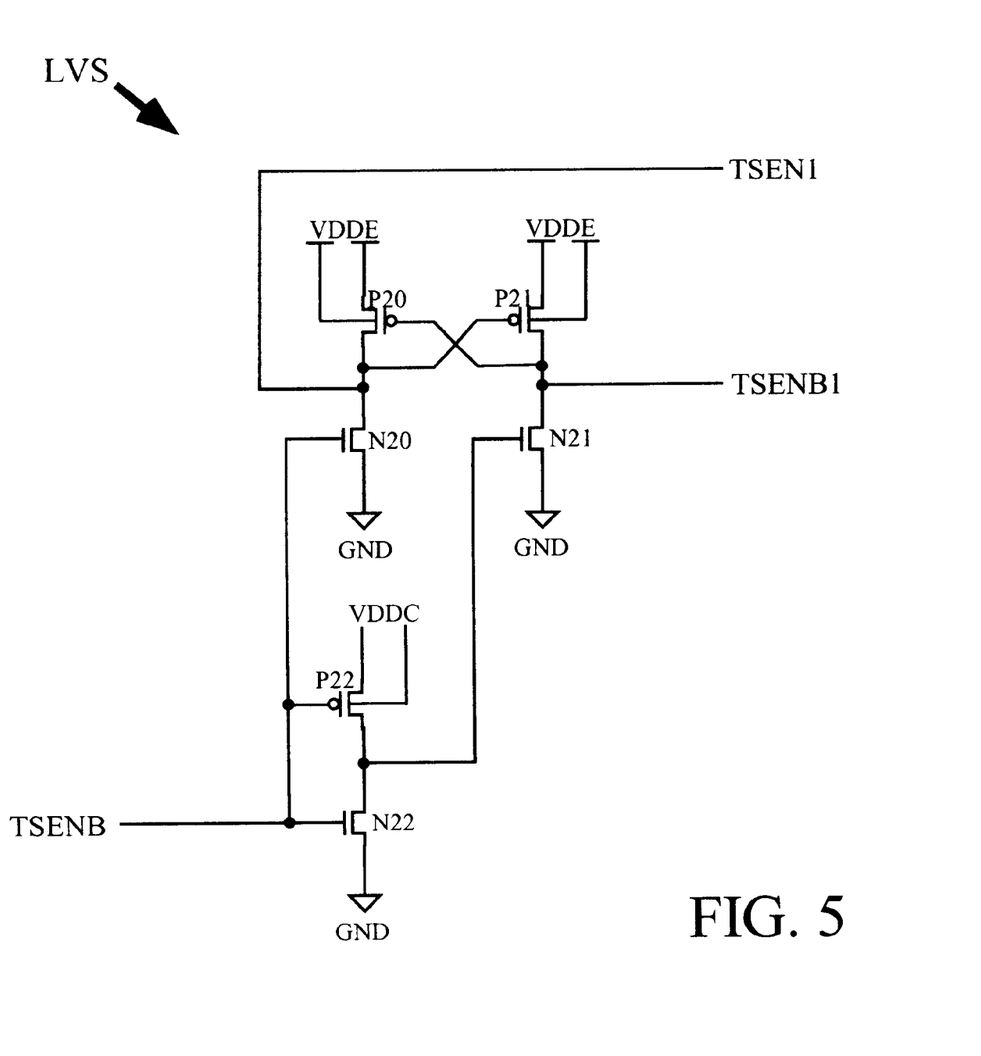
FIG. 5 is a schematic diagram of a level shifter circuit used in the embodiment of FIG. 4.

The output circuit of FIG. 4 includes N-channel transistors N0–N12, P-channel transistors P0–P12, inverters INVA, INV0, and INV1, NOR-gate NORC, and level shifters LVS and LVLS. The details of one embodiment of level shifter LVS are shown in FIG. 5 and described below. Device sizes for the N-channel and P-channel transistors of one embodiment are shown in Table 1. Device sizes for the inverters and NOR gate of the same embodiment are shown in Table 2. All device sizes are in microns, in length/width format.

In Table 1, devices with a channel length of 0.34 microns or above are I/O devices, which have a thicker oxide layer and a higher threshold voltage. Devices with a channel length of 0.22 microns or less are low voltage devices, which have a thinner oxide and a lower threshold voltage. In Table 2, all devices are low voltage devices.

TABLE 1

| Device | Size in Microns | Device | Size in Microns |
| --- | --- | --- | --- |
| P0  | 3.5/0.6  | N0  | 3/0.34 |
| P1  | 3.5/0.6  | N1  | 8/0.34 |
| P2  | 12/0.34  | N2  | 8/0.34 |
| P3  | 16/0.34  | N3  | 50/0.34 |
| P4  | 16/0.34  | N4  | 6/0.34 |
| P5  | 1.9/2    | N5  | 0.44/0.4 |
| P6  | 48/0.34  | N6  | 40/0.34 |
| P7  | 32/0.34  | N7  | 3.4/0.34 |
| P8  | 32/0.34  | N8  | 1/0.34 |
| P9  | 32/0.34  | N9  | 1/0.34 |
| P10 | 32/0.34  | N10 | 111/0.35 |
| P11 | 3.2/0.34 | N11 | 37/0.35 |
| P12 | 480/0.35 | N12 | 1.9/0.4 |

TABLE 1-continued

| Device | Size in Microns | Device | Size in Microns |
|---|---|---|---|
| P20 | 0.44/0.6 | N20 | 1.6/0.34 |
| P21 | 0.44/0.6 | N21 | 1.6/0.34 |
| P22 | 0.44/0.22 | N22 | 0.44/0.22 |

TABLE 2

| Logic Gate | Sizes in Microns: | |
|---|---|---|
| | P-channel | N-channel |
| NORC | 16/0.18 | 4/0.18 |
| INVA | 2.4/0.18 | 1.2/0.18 |
| INV0 | 2/0.22 | 1/0.4 |
| INV1 | 1/0.4 | 2/0.22 |

The output circuit of FIG. 4 includes one embodiment of level shifter 100, designated LVLS, which includes transistors P0, P1, N1, N2, and N5. Level shifter LVLS accepts input signal DATA, which has a power high voltage level of VDDC, and provides output signal B, which has a power high voltage level of VDDE.

P-channel transistor P0 and N-channel transistor N5 are coupled in series between power-high VDDE and ground GND, and are each gated by level shifter output node B. N-channel transistor N2 is coupled in parallel with N-channel transistor N5, and gated by input signal DATA. P-channel transistor P1 and N-channel transistor N1 are coupled in series between power-high VDDE and ground GND. P-channel transistor P1 is gated by the node (node F) between transistors P0 and N5. N-channel transistor N1 is gated by the inverse of input signal DATA (node A, provided by inverter INVA). The node between transistors P1 and N1 is level shifter output node B.

N-channel transistor N5 comes into play during the power-up sequence. At power-up, VDDC=VDDE=0 volts. Thus, input signal DATA is low (0 volts) and the output of inverter INVA (node A) is also low (VA=0 volts). As power high VDDE rises from 0 volts, nodes B and F both rise as well, generally in concert with VDDE (VB=VF=VDDE). (There might be some voltage drop from VDDE to each of these nodes.) However, as the voltage on node F rises to the N-channel threshold voltage (VF=Vtn), N-channel transistor N5 starts to pull node F down towards ground GND, turning on P-channel transistor P1. This, in turn, pulls node B to VDDE and it follows VDDE solidly to the operating power high value. Therefore, internal node PD will also follow VDDE solidly and leave output pull-up P12 solidly off after power-up.

Optional configurable slew rate control circuit CSRC includes NOR gate NORC and N-channel transistor N6. NOR gate NORC is driven by input signal DATA and a new input signal SLEWRATEB and gates N-channel transistor N6, which is coupled between internal node PD and ground GND. In one embodiment, NOR gate NORC uses the core voltage VDDC, rather than the power high level VDDE used by most of the output circuit.

Signal SLEWRATEB is a slew rate configuration signal. In one embodiment, the output circuit comprises a portion of a programmable logic device (PLD), and the slew rate configuration signal is stored in a configuration memory cell of the PLD.

The configurable slew rate control circuit functions as follows. When input signal SLEWRATEB is high, a slow slew rate is selected. The output of NOR gate NORC (node C) is low, and N-channel transistor N6 is off, i.e., does not participate in pulling down internal node PD. When input signal SLEWRATEB is low, a high slew rate is selected. When input signal DATA goes low, node C goes high, and N-channel transistor participates in pulling down internal node PD.

In one embodiment (see Table 1), N-channel transistor N7 is relatively small (i.e., slow), and N-channel transistor N6 is relatively large (i.e., fast). Therefore, setting input signal SLEWRATEB to a low value significantly speeds up the process of pulling down internal node PD, and therefore the process of pulling up output terminal PAD.

Optional enable circuit ENAB includes level shifter LVS, P-channel transistor P11, and N-channel transistors N8–N10 and N12. Input signal TSENB is an enable signal for the alternative path through the output circuit. When enable signal TSENB is high, the alternative path is disabled. When enable signal TSENB is low, the alternative path is enabled.

In one embodiment, the output circuit comprises a portion of a programmable logic device (PLD), and enable signal TSENB is stored in a configuration memory cell of the PLD.

Enable signal TSENB passes through level shifter LVS, which provides two output signals, TSENB1 (which follows enable signal TSENB) and the inverse of signal TSENB1, signal TSEN1. Signal TSENB1 is pulled low to ground GND through N-channel transistor N12, which is gated by signal TSEN1. (As described in conjunction with FIG. 5, N-channel transistor N12 corresponds to transistor N5 in level shifter LVLS, and thus can be considered to be part of level shifter LVS.)

Signal TSENB1 also drives an inverter made up of P-channel transistor P11 and N-channel transistor N8. The output of this inverter is designated node E in FIG. 4. Node E gates an N-channel transistor N0 coupled between output terminal PAD and a second internal node D. Signal TSENB1 gates an N-channel transistor N9 between node D and ground GND.

Enable circuit ENAB functions as follows. When enable signal TSENB is low, signal TSENB1 is low and signal TSEN1 is high. N-channel transistor N12 is on. P-channel transistor P11 is on, and N-channel transistors N8 and N9 are off. Therefore, node E is high. Transistor N0 is on, coupling output terminal PAD to node D. Hence, the circuit functions the same way as the circuit shown in FIG. 2. The alternative path is enabled.

When enable signal TSENB is high, signal TSENB1 is high and signal TSEN1 is low. N-channel transistor N12 is off. P-channel transistor P11 is off, and N-channel transistors N8 and N9 are on. Therefore, nodes E and D are both low. Because node D is low, P-channel transistor P2 is on, coupling internal node PD to level shifter output node B. Transistor N0 is off, decoupling output terminal PAD from node D. Hence, the circuit functions the same way as the prior art circuit shown in FIG. 1. The alternative path is disabled.

Enable circuits are well known in the art of electronic circuit design. Therefore, many different types of enable circuits are known, and can be optionally included in the output circuit of the present invention.

Optional high voltage tolerance circuit HVT includes P-channel transistors P3, P5, and P6. P-channel transistor P3 is coupled in parallel with N-channel transistor N0, and is gated by power high VDDE. P-channel transistor P5 is coupled between internal node PD and power high VDDE and gated by output terminal PAD. P-channel transistor P6 is coupled between output terminal PAD and internal node PD, and is gated by power high VDDE.

As with many output circuits, output terminal PAD can also function as an input terminal to receive signals from other ICs in the system. (The input path is not shown in FIGS. 2 and 4, but is well known in the art of output circuit design.) Therefore, it is desirable for output terminal PAD to handle input signals at various voltage levels. The voltage on output terminal PAD (VPAD) may go higher than either of VDDC or VDDE. For example, when VDDC and VDDE are both 1.8 volts, VPAD could be driven to 3.6 volts.

Assume the alternative path is enabled (TSENB is low) and the slew rate is configured to be high (SLEWRATEB is low). When input signal DATA is high (VDATA=1.8 volts), node B is high (VB=1.8 volts), and N-channel transistors N3 and N4 are both turned on, pulling internal node PD to a voltage level of VDDE minus Vtn (1.8 volts−Vtn). Because enable signal TSENB is low, signal TSENB1 is low. Therefore, N-channel transistor N9 is off, the voltage at node E is VDDE (VE=1.8 volts), and N-channel transistor N0 is on.

When VPAD=0 volts, the voltage at node D (VD) is also 0 volts (pulled low through transistor N0). Therefore, P-channel transistor P2 is on. Therefore, the high voltage at node B (1.8 volts) is passed through transistor P2, pulling internal node PD all the way to 1.8 volts (VPD=VDDE =1.8 volts). Transistor P5 also helps to pull internal node PD to VDDE.

When VPAD rises to the VDDE level (when VPAD= VDDE=1.8 volts, continuing with the present example), the voltage at node D (VD) rises, but is attenuated by passing through transistor N0, i.e., VD=VDDE−Vtn. Therefore, transistor P2 is not fully turned on. P-channel transistor P5 is off. During this "gray period", the voltage on internal node PD remains at 1.8 volts (VPD=VDDE), or can drop below 1.8 volts.

Once VPAD is higher than VDDE, P-channel transistor P6 is on and causes the voltage on internal node PD (VPD) to follow VPAD. Therefore, VPD=VPAD and output pull-up P12 is turned fully off. P-channel transistor P3 turns on, and causes the voltage on node D (VD) to follow VPAD. Therefore, transistor P2 is also fully off.

Therefore, it can be seen that in the embodiment of FIG. 4, when the voltage on internal node PD (VPD) is high, P-channel transistors P3, P5, and P6 cause VPD to follow the higher of the two voltage levels VDDE and VPAD. Hence, the output circuit is tolerant of voltages on the output terminal that are higher than the power high voltage of the output circuit. Because of this capability, the output pull-up always turns completely off when internal node PD is high, and there is no leakage current through the pull-up.

Optional ground bounce current reduction circuit GBCR includes inverters INV0 and INV1 and N-channel transistor N11. N-channel transistor N11 is coupled between output terminal PAD and ground GND. Inverters INV0 and INV1 are coupled in series, with the input terminal of inverter INV0 coupled to receive the ND input signal and the output of inverter INV1 (node ND2) gating N-channel transistor N11. Thus, signal ND2 is a delayed version of input signal ND.

Ground bounce current reduction circuit GBCR functions as follows. When input signal ND goes high (VND=VDDC), first N-channel transistor N10 turns on and then, after the delay through inverters INV0 and INV1, N-channel transistor N11 turns on. The effect is to increase the fall time on output terminal PAD (which is normally much shorter than the rise time), and thus decrease the typical ground bounce current. The devices in the two inverters can be sized to control the ground bounce current as desired in the targeted system application.

The ground bounce current reduction circuit also functions to reduce overlap current. Overlap current is the current that flows when the output pull-up (transistor P12) and the output pull-down(s) are both on. This condition occurs briefly when the output pull-down(s) turn on before the output pull-up is completely off. By delaying turning on a portion of the pull-down width (i.e., by turning on transistor N11 after transistor N10 is already on and preferably after transistor P12 is off), the overlap current is reduced.

Optional N-well control circuit NWC includes three pull-ups (P-channel transistors P4, P7, and P8) coupled between node NWELL and power high VDDE and gated by node D, node NWELL, and output terminal PAD, respectively. The circuit further includes two P-channel transistors P9 and P10 coupled between output terminal PAD and node NWELL and gated by power high VDDE and node NWELL, respectively.

N-well control circuit NWC functions to keep node NWELL at the higher of power high VDDE and the voltage on output terminal PAD. This is desirable because, for example, if the voltage level of node NWELL is lower than the voltage on output terminal PAD, then P-channel transistors P3 and P12 function as forward bias diodes rather than as reverse-biased diodes, as desired.

N-well control circuit NWC functions as follows. When the voltage on output terminal PAD (VPAD) is between 0 volts and power high VDDE minus the absolute value of the P-channel threshold voltage (i.e., when 0 volts<VPAD<VDDE−|Vtp|), transistors P4 and P8 pull node NWELL to VDDE. When VDDE−|Vtp|<VPAD<VDDE, transistor P7 keeps node NWELL at VDDE. When VDDE<VPAD<VDDE+|Vtp|, transistor P10 pulls node NWELL to VPAD. When VPAD>VDDE+|Vtp|, transistor P9 turns on and keeps node NWELL at VPAD. Therefore, the voltage at node NWELL is always kept to the higher of VDDE and VPAD.

FIG. 5 shows one embodiment of level shifter LVS, which includes transistors P20, P21, P22, N20, N21, and N22. Level shifter LVS accepts input signal TSENB, which has a power high voltage level of VDDC, and provides output signals TSENB1 and TSENB, which have power high voltage levels of VDDE.

P-channel transistor P20 and N-channel transistor N20 are coupled in series between power-high VDDE and ground GND. P-channel transistor P20 is gated by the node (TSENB1) between transistors P21 and N21. N-channel transistor N20 is gated by input signal TSENB. The node between transistors P20 and N20 is level shifter output node TSEN1. P-channel transistor P21 and N-channel transistor N21 are coupled in series between power-high VDDE and ground GND. P-channel transistor P21 is gated by node TSEN1. N-channel transistor N21 is gated by the inverse of input signal TSENB, provided by an inverter formed from transistors P22 and N22. The node between transistors P21 and N21 is level shifter output node TSENB1.

Note that level shifter LVS combined with N-channel transistor N12 (see FIG. 4) forms a circuit that is the same as level shifter LVLS combined with inverter INVA. This is one example of the ways in which transistors can be grouped to provide the different output functions described above. FIG. 4 shows only one method of grouping the transistors into circuits, a method that was found to be convenient for explaining the various functions of the output circuit.

N-channel transistor N12 plays the same role for level shifter LVS in the power-up sequence as is played by N-channel transistor N5 in level shifter LVLS.

Note also that the inverter formed by transistors P22 and N22 is coupled between the core voltage level VDDC and ground GND. This coupling can also be used in inverter INVA of FIG. 4.

In other embodiments, N-channel transistors and P-channel transistors are replaced by their counterpart devices (N-channel devices with P-channel devices and vice versa) and gated by the inverted gating signal, a substitution technique that is well known in the art of circuit design. These and other variations on the described embodiments are encompassed by the present invention.

Those having skill in the relevant arts of the invention will now perceive various modifications and additions that may be made as a result of the disclosure herein. For example, the above text describes the output circuits of the invention in the context of ICs including PLDs. However, the invention can also be applied to other fields of the electronic design art. Further, transistors, pull-ups, pull-downs, inverters, and NOR gates other than those described herein can be used to implement the invention. Moreover, some components are shown directly connected to one another while others are shown connected via intermediate components. In each instance, the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. An output circuit compatible with a plurality of voltage levels, comprising:
   a first data input terminal providing a first data input signal;
   a second data input terminal providing a second data input signal;
   an internal node;
   an output terminal;
   a level shifter having an input node coupled to the first data input terminal and an output node;
   a first pull-up coupled between the output terminal and a power high VDDE, and having a gate terminal coupled to the internal node;
   a first pull-down coupled between the output terminal and a ground GND, and having a gate terminal coupled to the second data input terminal;
   a second pull-up coupled between the internal node and the power high VDDE, and having a gate terminal coupled to the first data input terminal;
   a second pull-down coupled between the internal node and the ground GND, and having a gate terminal coupled to receive an inverse signal from the first data input signal;
   a third pull-up coupled between the internal node and the power high VDDE, and having a gate terminal coupled to the output node of the level shifter; and
   a pass transistor coupled between the internal node and the output node of the level shifter, and having a gate terminal coupled to the output terminal.

2. The output circuit of claim 1, wherein the output circuit is implemented in a CMOS integrated circuit.

3. The output circuit of claim 2, wherein:
   the first pull-up comprises a first P-channel transistor;
   the first pull-down comprises a first N-channel transistor;
   the second pull-up comprises a second N-channel transistor;
   the second pull-down comprises a third N-channel transistor;
   the third pull-up comprises a fourth N-channel transistor; and
   the pass transistor comprises a second P-channel transistor.

4. The output circuit of claim 3, wherein the first and second P-channel transistors each have an N-well terminal, and the output circuit further comprises:
   an N-well node coupled to the N-well terminals of the first and second P-channel transistors; and
   an N-well control circuit coupled to the N-well node and the output terminal, and further coupled to provide the greater of a voltage level of the power high VDDE and a voltage level placed on the output terminal by an external source to the N-well node.

5. The output circuit of claim 1, further comprising a configurable slew rate control circuit coupled to the internal node.

6. The output circuit of claim 5, wherein the configurable slew rate control circuit comprises:
   a slew rate input terminal providing a slew rate configuration signal;
   a NOR gate having first and second input nodes coupled to the first data input terminal and the slew rate input terminal, and further having an output node; and
   a third pull-down coupled between the internal node and the ground GND, and having a gate terminal coupled to the output node of the NOR gate.

7. The output circuit of claim 6, wherein the output circuit comprises a portion of a programmable logic device (PLD), and the slew rate configuration signal is stored in a configuration memory cell of the PLD.

8. The output circuit of claim 1, further comprising an enable circuit coupled to the internal node and the output terminal.

9. The output circuit of claim 8, wherein the enable circuit comprises:
   an enable input terminal providing an enable signal;
   a level shifting circuit having an input node coupled to the enable input terminal and an output node;
   an inverter having an input node coupled to the output node of the level shifting circuit and an output node;
   an N-channel transistor coupled between the output terminal and the gate terminal of the pass transistor, the N-channel transistor having a gate terminal coupled to the output node of the inverter; and
   a third pull-down coupled between the gate terminal of the pass transistor and the ground GND, and having a gate terminal coupled to the output node of the level shifting circuit.

10. The output circuit of claim 9, wherein the output circuit comprises a portion of a programmable logic device (PLD), and the enable signal is stored in a configuration memory cell of the PLD.

11. The output circuit of claim 9, further comprising a high voltage tolerance circuit coupled to the internal node, the output terminal, and the gate terminal of the pass transistor.

12. The output circuit of claim 11, wherein the high voltage tolerance circuit comprises:
- a first P-channel transistor coupled between the gate terminal of the pass transistor and the output terminal, and having a gate terminal coupled to the power high VDDE;
- a second P-channel transistor coupled between the internal node and the power high VDDE and having a gate terminal coupled to the output terminal; and
- a third P-channel transistor coupled between the output terminal and the internal node and having a gate terminal coupled to the power high VDDE.

13. The output circuit of claim 1, further comprising a ground bounce current reduction circuit coupled to the output terminal.

14. The output circuit of claim 13, wherein the ground bounce current reduction circuit comprises:
- a first delay element having input and output nodes;
- a second delay element having input and output nodes; and
- a third pull-down coupled between the output terminal and the ground GND and having a gate terminal, wherein:
  - the input node of the first delay element is coupled to the second data input terminal,
  - the output node of the first delay element is coupled to the input node of the second delay element, and
  - the output node of the second delay element is coupled to the gate terminal of the third pull-down.

15. The output circuit of claim 1, wherein the second data input signal is a delayed version of the first data input signal.

16. The output circuit of claim 1, wherein the first and second data input signals are derived from a common data input signal.

17. The output circuit of claim 1, wherein the first and second data input signals are the same signal.

18. An output circuit compatible with a plurality of voltage levels, comprising:
- a first data input terminal providing a first data input signal;
- a second data input terminal providing a second data input signal;
- an internal node;
- an output terminal;
- a level shifter having an input node coupled to the first data input terminal and an output node providing a level shifter output signal;
- a first pull-up coupled between the output terminal and a power high VDDE, and having a gate terminal coupled to the internal node;
- a first pull-down coupled between the output terminal and a ground GND, and having a gate terminal coupled to the second data input terminal;
- means for applying the first data input signal to the internal node without passing through the level shifter;
- means for applying a voltage level of the power high VDDE to the internal node when the level shifter output signal is high; and
- means for applying the level shifter output signal to the internal node when a value on the output terminal is low.

19. The output circuit of claim 18, wherein the output circuit is implemented in a CMOS integrated circuit.

20. The output circuit of claim 18, further comprising means for configuring a slew rate of the output circuit by controlling a fall time on the internal node.

21. The output circuit of claim 20, wherein the output circuit comprises a portion of a programmable logic device (PLD), and the means for configuring the slew rate of the output circuit comprises a slew rate configuration signal stored in a configuration memory cell of the PLD.

22. The output circuit of claim 18, further comprising means for disabling the means for applying the first data input signal to the internal node without passing through the level shifter.

23. The output circuit of claim 22, wherein the output circuit comprises a portion of a programmable logic device (PLD), and the means for disabling comprises an enable signal stored in a configuration memory cell of the PLD.

24. The output circuit of claim 22, further comprising means for tolerating a voltage level on the output terminal higher than a voltage level of the power high VDDE.

25. The output circuit of claim 18, further comprising means for reducing ground bounce current on the output terminal.

26. The output circuit of claim 18, wherein the first pull-up further has an N-well terminal, and the output circuit further comprises means for providing to the N-well terminal the greater of a voltage level of the power high VDDE and a voltage level placed on the output terminal by an external source.

27. The output circuit of claim 18, further comprising means for providing to the internal node the greater of a voltage level of the power high VDDE and a voltage level placed on the output terminal by an external source.

28. An output circuit compatible with a plurality of voltage levels, comprising:
- a first data input terminal providing a first data input signal;
- a second data input terminal;
- an output terminal;
- an internal node;
- a level shifter having an input node coupled to the first data input terminal and providing a level shifter output signal;
- a pull-up coupled between the output terminal and a power high VDDE and having a gate terminal coupled to the internal node;
- a pull-down coupled between the output terminal and a ground GND and having a gate terminal coupled to the second data input terminal;
- means for applying the level shifter output signal to the internal node; and
- means for applying the first data input signal to the internal node without passing through the level shifter.

29. The output circuit of claim 28, further comprising means for configuring a slew rate of the output circuit by controlling a fall time on the internal node.

30. The output circuit of claim 29, wherein the output circuit comprises a portion of a programmable logic device (PLD), and the means for configuring the slew rate of the output circuit comprises a slew rate configuration signal stored in a configuration memory cell of the PLD.

31. The output circuit of claim 28, further comprising means for disabling the means for applying the first data input signal to the internal node without passing through the level shifter.

32. The output circuit of claim 31, wherein the output circuit comprises a portion of a programmable logic device (PLD), and the means for disabling comprises an enable signal stored in a configuration memory cell of the PLD.

33. The output circuit of claim 31, further comprising means for tolerating a voltage level on the output terminal higher than a voltage level of the power high VDDE.

34. The output circuit of claim 28, further comprising means for reducing ground bounce current on the output terminal.

35. The output circuit of claim 28, wherein the pull-up further has an N-well terminal, and the output circuit further comprises means for providing to the N-well terminal the greater of a voltage level of the power high VDDE and a voltage level placed on the output terminal by an external source.

36. The output circuit of claim 28, further comprising means for providing to the internal node the greater of a voltage level of the power high VDDE and a voltage level placed on the output terminal by an external source.

* * * * *